United States Patent [19]

Knight

[11] 4,106,012

[45] Aug. 8, 1978

[54] MONITORING IDENTIFIED ELECTRICAL SWITCH CONTACTS

[75] Inventor: Harry Wilson Knight, Stockton-on-Tees, England

[73] Assignee: Imperial Chemical Industries Limited, London, England

[21] Appl. No.: 718,626

[22] Filed: Aug. 30, 1976

[30] Foreign Application Priority Data

Sep. 3, 1975 [GB] United Kingdom ............... 36275/75

[51] Int. Cl.$^2$ ..................... G08B 23/00; G06M 3/06
[52] U.S. Cl. .......................... 340/523; 235/92 EA; 340/524; 340/336
[58] Field of Search .......................... 340/223, 415

[56] References Cited

U.S. PATENT DOCUMENTS

| 3,524,185 | 8/1970 | Ehni | 340/415 |
| 3,760,394 | 9/1973 | Fletcher et al. | 340/223 |
| 3,965,469 | 6/1976 | Ryan | 340/415 |

*Primary Examiner*—David L. Trafton
*Attorney, Agent, or Firm*—Cushman, Darby & Cushman

[57] ABSTRACT

A system for monitoring a plurality of identified electric signals and the order in which they occur, comprising an electric pulse generator which generates an electric pulse upon receiving each electric signal, a serial counter which is incremented upon receiving an electric pulse from the generator, a data latch pulse system associated with each electric signal and which operates upon receiving the electric signal, a parallel data latch system which is operated by the data latch pulse system, and which accepts and holds the serial data held in the serial counter upon receiving the electric signal, a display decoder connected to the output of the parallel data latch system, and at least one display unit connected to the display decoder and displaying the number held in the serial counter upon receiving the electric signal.

2 Claims, 1 Drawing Figure

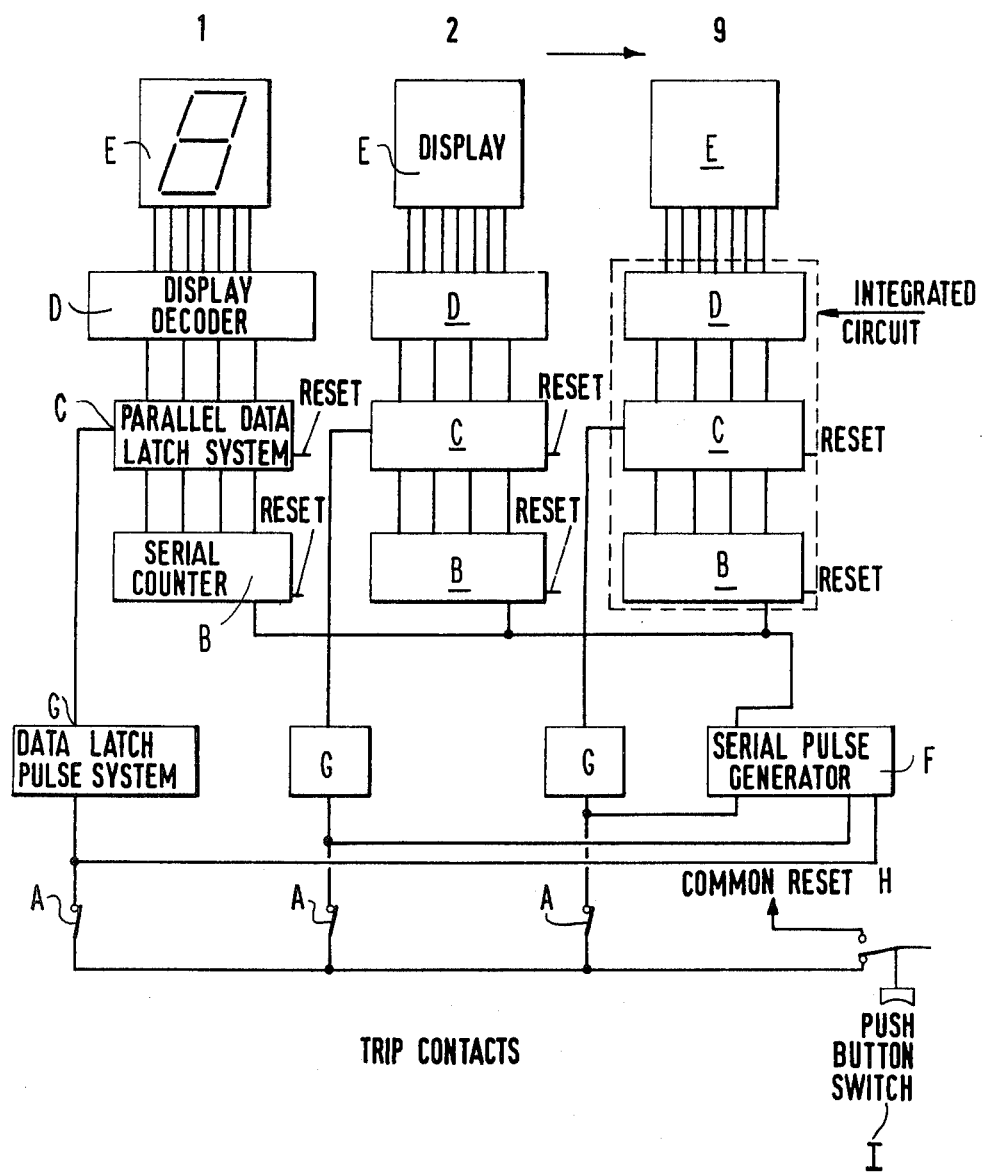

MONITORING IDENTIFIED ELECTRICAL SWITCH CONTACTS

The present invention relates to a system for monitoring identified electric signals and the order in which they occur, and in particular to monitoring electric switch contacts, the action of which may or may not be interdependent with one another by virtue of their association with physical conditions existing in a piece of machinery, chemical plant or process, or mechanical, electrical or pneumatic equipment. The system is arranged to hold and display the sequence in which a set of identified electric switch contacts is operated. In particular the system is arranged to hold and display the sequences in which a set of identified electric contacts of a trip system goes open circuit.

According to the present invention a system for monitoring a plurality of identified electric signals and the order in which they occur comprises in combination:

(a) an electric pulse generator capable of generating an electric pulse in response to the receipt of each of the said electric signals, (b) a serial counter capable of being incremented on receipt of an electric pulse from the said electric pulse generator, (c) a data latch pulse system associated with each of the said electric signals and adapted to operate on receipt of the said electric signal, (d) a parallel data latch system operable by the said data latch pulse system, and adapted to accept and hold the serial data held in the said serial counter following receipt of the said electric signal, (e) a display decoder connected to the output of the said parallel data latch system, and (f) at least one display unit connected to the said display decoder and capable of displaying a representation of the number held in the serial counter following receipt of the said electric signal.

The system can be adapted to operate as and when contacts open, as and when contacts close and, indeed, whenever electric signals are produced as a result of some change of state in machinery, plant, process, equipment, etc. that is being monitored.

The display arrangement can conveniently be by an alpha numeric opto-electric system, for example by numerals or letters utilizing 7-segment LED (light-emitting diode) type displays, numicator tubes (eg "NIXIE" - Registered Trade Mark), liquid crystal displays, cold cathode, hot wire incandescent devices, or other known display arrangements.

In a simple embodiment of the invention the sequence may be displayed on nine 7-segment LED numerical indicators, one indicator being allocated to each contact. When a trip occurs, the indicators are energised; the indicator for the first contact to open shows 1, that for the second contact to open shows 2, and so on. The system can be extended to monitor up 99 99contacts by using two numerical indicators per contact, or up to 999 or 9999 contacts by using three or four indicators per contact, and so on.

The monitoring system of the invention works as follows:

When an electric signal is initiated by virtue of an electric switch contact operating, an electric serial counter pulse is generated and is used to increment a serial counter, which can either be unique to the initiating electric switch contact or common to all the electric switch contacts. The initiating contact also causes an electric data latch pulse system to operate a "parallel data latch" system which accepts and holds the serial data held in the serial counter at a point in time following the operation of the initiating contact. This parallel data latch system is unique to each electric switch contact being monitored.

The output of the parallel data latch system is then decoded by an associated display decoder (each display decoder likewise being unique to the electric switch contact being monitored) in such a way as to display, via an opto-electrical display system (each display system likewise being unique to the electric switch contact being monitored) the number currently held in the serial counter at a point in time following the operation of the initiating contact.

Thus if there are nine 7-segment LED numerical indicators monitoring nine trip contacts, and it is the eighth contact that trips first, the serial counter will hold the FIG. 1 and this will be displayed on the eighth display indicator; if the fourth contact trips second, the serial counter will hold the FIG. 2 and this will be displayed on the fourth display indicator, and so on. The time resolutions of the system may be altered by varying the discrimination time between contacts, so that two or more contacts that operate at substantially the same time, or within a defined acceptance "window", will display the same numbers.

Decimal points on the numerical indicators may be used to indicate if a trip was initiated by a fleeting contact.

As mentioned above, the serial counter may be unique to each contact, or common to all the contacts, but the parallel data latch system and display decoder must be unique to each contact. While the monitoring system of the invention can readily be assembled from individual components, it is more convenient to use, unique for each contact, a commercially available TTL (transistor-transistor-logic) circuit that combines a serial counter, parallel data latch system and display decoder.

One embodiment of the invention for monitoring a sequence of nine trip contacts is illustrated in the accompanying drawing which is a block diagram.

The nine trip contacts are designated A. The combination of a serial counter by a parallel data latch system C and a display decoder D associated with each trip contact A may comprise a commercially available TTL integrated circuit, (although alternatively the serial counter B may be common to all nine trip contacts A. The display for each of the nine separate circuits, one being for each trip contact, is a 7-segment LED numerical indicator E that will display any number from 1 to 9.

If the first trip contact A operates, the resulting electric signal causes an electric pulse to be generated by a serial pulse generator F, which increments each of the serial counters B. The initiating contact also causes its own data latch pulse system G to generate an electric pulse which operates its own parallel data latch system C which accepts and holds the serial data held in the serial counter B (namely the number 1) following the initiating contact. The output of the parallel data latch system C is connected to its own display decoder D, which decodes in such a way that the first numerical indicator E displays the number currently held in the serial counter B (namely the number 1) following the initiating contact A, thus showing that the first trip contact was the first to operate.

However, the next trip contact A to operate may be the ninth. If so, the number in the serial counters B will be incremented from 1 to 2, and the ninth numerical indicator E will display the number 2, showing that the ninth trip contact A was the second to close. If the second trip contact A operates next, the second numerical indicator E will display the number 3, and so on.

A common resetting arrangement H, operable by a push button switch I or equivalent device, may be provided for the serial counters B and parallel data latch systems C to prime the system, ready for the next set of operations, after a sequence of trips has occurred.

I claim:

1. A system for monitoring a plurality of identified electric signals and the order in which they occur, comprising in combination:
   (a) an electric pulse generator capable of generating an electric pulse in response to the receipt of each of the said electric signals,
   (b) a plurality of serial counters each capable of being incremented on receipt of an electric pulse from the said electric pulse generator,
   (c) a plurality of a data latch pulse systems each associated with one of the said electric signals and adapted to operate on receipt of the said electric signal,
   (d) a plurality of a parallel data latch systems each operable by one of the said data latch pulse systems, and adapted to accept and hold the serial data held in the said serial counter following the receipt of the said electric signal,
   (e) a plurality of a display decoders each connected to the output of one of the said parallel data latch systems, and
   (f) a plurality of display units connected to the said display decoder and each associated with one of said signals and capable of displaying a representation of the number held in the parallel data latch following receipt of the said electric signal.

2. A system according to claim 1 in which the display units comprise 7-segment light-emitting diode numerical indicators.

* * * * *